US 7,724,515 B2

(12) United States Patent
Fukuda et al.

(10) Patent No.: US 7,724,515 B2
(45) Date of Patent: May 25, 2010

(54) DISK ARRAY APPARATUS

(75) Inventors: Hiroshi Fukuda, Odawara (JP); Hitoshi Matsushima, Ryugasaki (JP)

(73) Assignee: Hitachi, Ltd., Tokyo (JP)

( * ) Notice: Subject to any disclaimer, the term of this patent is extended or adjusted under 35 U.S.C. 154(b) by 235 days.

(21) Appl. No.: 12/010,291

(22) Filed: Jan. 23, 2008

(65) Prior Publication Data

US 2008/0259563 A1 Oct. 23, 2008

(30) Foreign Application Priority Data

Apr. 17, 2007 (JP) .............................. 2007-108075

(51) Int. Cl.
G06F 1/20 (2006.01)
H05K 7/20 (2006.01)
F01N 13/00 (2010.01)

(52) U.S. Cl. .............................. 361/679.5; 361/679.48; 361/679.49; 361/679.51; 361/692; 361/694; 361/695; 181/206; 181/224; 181/225; 454/184; 454/906

(58) Field of Classification Search ............ 361/679.46, 361/679.48–679.51, 690, 692, 694–695, 361/716; 165/80.3; 181/202, 206, 224–225; 312/223.2, 236; 454/184, 906
See application file for complete search history.

(56) References Cited

U.S. PATENT DOCUMENTS

| | | | | |
|---|---|---|---|---|
| 4,165,798 A | * | 8/1979 | Martinez | ..................... 181/268 |
| 6,781,829 B2 | * | 8/2004 | Hein | ...................... 361/679.33 |
| 6,796,859 B1 | * | 9/2004 | Justen et al. | .............. 440/88 A |
| 6,804,360 B1 | * | 10/2004 | Misawa et al. | ............. 381/71.5 |
| 6,927,961 B2 | * | 8/2005 | Schestak | ..................... 361/103 |
| 6,927,980 B2 | * | 8/2005 | Fukuda et al. | .............. 361/700 |
| 7,133,282 B2 | * | 11/2006 | Sone | ...................... 361/679.32 |
| 7,280,354 B2 | * | 10/2007 | Sone | ...................... 361/679.33 |
| 7,282,873 B2 | * | 10/2007 | Abali et al. | .................... 318/41 |
| 7,353,908 B1 | * | 4/2008 | French | ........................ 181/206 |
| 7,643,285 B2 | * | 1/2010 | Nishiyama et al. | ...... 361/679.49 |
| 2005/0094823 A1 | * | 5/2005 | Kobori et al. | .............. 381/71.5 |
| 2006/0103334 A1 | * | 5/2006 | Abali et al. | .................... 318/67 |
| 2006/0185931 A1 | * | 8/2006 | Kawar | ........................ 181/202 |
| 2008/0032618 A1 | * | 2/2008 | Katoh et al. | ................. 454/143 |

FOREIGN PATENT DOCUMENTS

| | | | | |
|---|---|---|---|---|
| CN | 1818395 | A | * | 8/2006 |
| JP | 61257313 | A | * | 11/1986 |
| JP | 04214699 | A | * | 8/1992 |
| JP | 08156367 | A | * | 6/1996 |
| JP | 10220953 | A | * | 8/1998 |
| JP | 10247086 | A | * | 9/1998 |
| JP | 10265067 | A | * | 10/1998 |
| JP | 11287544 | A | * | 10/1999 |
| WO | WO 02071820 | A1 | * | 9/2002 |

* cited by examiner

*Primary Examiner*—Jayprakash N Gandhi
*Assistant Examiner*—Robert J Hoffberg
(74) *Attorney, Agent, or Firm*—Volpe and Koenig, P.C.

(57) ABSTRACT

In a disk array apparatus, by taking note of a first sound of a specific frequency which is a noise element of original sounds generated from a fan, a second sound whose phase is inverted to that of the first sound is generated by a structure of a cooling air flow path passing through the fan, and the second sound is synthesized with the first sound on the cooling air flow path, thereby reducing the noise. For example, an exhaust duct is located on a fan unit in an upper part of the apparatus, two flow paths extending to an exhaust port are formed in an internal structure of the exhaust duct, and the two flow paths are designed so that the difference in the flow path length therebetween becomes equivalent to half wavelength of the specific frequency.

3 Claims, 11 Drawing Sheets

Prior Art

US 7,724,515 B2

DISK ARRAY APPARATUS

CROSS-REFERENCE TO RELATED APPLICATION

The present application claims priority from Japanese Patent Application No. JP 2007-108075 filed on Apr. 17, 2007, the content of which is hereby incorporated by reference into this application.

TECHNICAL FIELD OF THE INVENTION

The present invention relates to a disk array apparatus (also called a storage apparatus and others) having a function to control a storage device such as a hard disk drive (HDD). More particularly, it relates to a cooling structure by means of fans (blower) and a noise reduction and soundproof structure of the apparatus.

BACKGROUND OF THE INVENTION

In recent years, disk array apparatus with higher mounting density and higher performance has been developed. Accordingly, higher cooling performance has also been demanded in order to cope with the temperature rise due to the increase in heat generation of component parts and resulting performance deterioration.

For example, in a comparatively large disk array apparatus, a cooling method by means of high power fans (exhaust fan and air cooling fan) installed in the upper part of the apparatus has been adopted. A frequently-used cooling structure in a conventional large disk array apparatus is as follows. That is, a cooling air is taken in from front and rear surfaces and a bottom surface of the apparatus chassis by the operation of fans installed in an upper part of the apparatus, and the cooling air passes upward through a module group such as a HDD and a logic board and through the inside (duct) of the chassis and is then exhausted from the fans in the upper part of the apparatus. By this means, components in the apparatus are air-cooled.

SUMMARY OF THE INVENTION

In the above-mentioned cooling method using fans in the disk array apparatus, the amount of air supplied by the fans has to be increased in order to improve the cooling performance so as to cope with the increase of heat generation due to the increase of mounting density in the apparatus. However, it causes a problem of a higher noise. Corresponding sounds are generated mainly by the rotation of fan blades in an air blowing operation. The fan is a main noise source in the apparatus. Conventionally, with respect to the noises caused by the fans, a noise reduction structure has not been provided especially.

In a conventional structure, noises caused by a fan in a fan unit in the upper part of the apparatus are directly radiated to an outside space, and noises caused by a fan in a fan unit in the intermediate part of the apparatus are also directly transmitted to an outside space through a perforated door.

Moreover, noise insulation materials and noise absorbing materials have been used as general measures for reduction of fan noises. However, there is a possibility that the cooling performance is deteriorated because the above measures become the interference against the intake and exhaust of cooling air.

The present invention has been made in consideration of the above-described problems, and an object thereof is to provide a technology by which noises caused by a fan can be prevented and reduced while securing the cooling performance of the whole apparatus in the relatively large disk array apparatus in which high density mounting and cooling performance are taken into consideration.

The typical ones of the inventions disclosed in this application will be briefly described as follows. In order to realize the above-described object, the present invention provides a technology for a disk array apparatus, in which storage devices (disk array) such as a HDD and a control device thereof (controller or disk controller) are provided, components thereof (modules for storage devices, logic boards, and power sources) are installed in a chassis (box, backboard, and others), and each unit is air-cooled using fans, and it is characterized by comprising technological means and configurations described below.

In this apparatus, the phases of noises generated from fans are inverted by acoustic means (mechanical and controlled means corresponding thereto), and the inverted noises are overlapped (synthesized) on original sounds on a cooling air flow path, thereby reducing the noise. Moreover, the noise reduction is carried out, while maintaining the cooling performance of the apparatus (exhaust and intake efficiency of cooling air). This configuration uses a basic acoustic principle (referred to as noise reduction by synthesizing phase-inverted sounds, first means, and the like), in which the noise element is cancelled (noise cancellation) by overlapping a sound wave (second sound), whose phase is inverted, on an original sound wave (first sound) corresponding to a noise element (specific frequency) of a fan. In this apparatus, by taking note of a specific (inherent) frequency to be a noise element of the sounds generated from the fans provided in the apparatus, a sound (second sound) whose phase is inverted for the wavelength ($\lambda$) thereof is produced by predetermined means such as a duct structure, and the noise is reduced by overlapping the second sound on the original sound (first sound). In this manner, noises are reduced in comparison with, at least, those of a conventional configuration.

In the basic configuration of this apparatus, a power source unit, a logic board box, a second fan unit in the intermediate part, a storage device box, and a first fan unit in the upper part are disposed in this order from the bottom. The fan unit is provided with, for example, a plurality of fans. The fan is, for example, an axial fan. Further, a duct structure for assisting the exhaust and intake by the fan is provided in the apparatus. Main cooling air flow paths in the apparatus are as follows. By the operation of the fan unit, cooling air is taken in from the outside through an opening in the bottom surface of the apparatus and others (intake port, ventilation hole, and the like), and the cooling air which passes through a group of modules to cool the same passes through ducts inside (at the center) and near the side surfaces and the fan units, and then it is exhausted to the outside through an opening (exhaust port, ventilation hole, and the like) in the upper surface of the apparatus.

The apparatus has the following configurations as the first means. Also, further improved effects are obtained by adopting the combination of the configurations.

(1) As a first configuration, that is, as a configuration with the improved structure of cooling air flow paths, the configuration in which phase-inverted sounds are produced and synthesized by use of a difference in length of flow paths such as ducts is provided. According to the first configuration, for example, in a structure of cooling air flow paths from the air intake from the outside to the exhaust to the outside including a space where sounds generated by fans are propagated in the apparatus, in other words, in the structure of a chassis and ducts which form the paths, the second sounds are produced by a difference in the flow path length among flow paths divided into two or more paths, and the second sounds are overlapped on (joined together with) the first sounds especially at the positions where noise measures are required, thereby reducing the noise. The above-mentioned difference in the flow path length is assumed to be half the wavelength (λ/2) of a specific frequency of a fan. The first configuration will be described in more detail below.

(1-2) For example, an exhaust duct is further disposed on the first fan unit in the upper part of the apparatus, and a structure for providing the difference in the flow path length is disposed in the exhaust duct. More specifically, in accordance with the positions of exhaust ports of the fans in the first fan unit, a flow path is divided into one first flow path and the other second flow path by means of partition plates and positions of exhaust ports in the exhaust ducts, and a difference in the flow path length is made equivalent to half the wavelength mentioned above.

(1-2) For example, in the first cooling air flow path through the first fan unit in the upper part of the apparatus, a first duct unit including two or more ducts is disposed in the middle of the path, and the difference in the flow path length is provided by the pair of ducts. More specifically, in accordance with the positions of the fans, shapes and others of the pair of the ducts are changed, and a difference in the flow path length between one flow path in a first duct and the other flow path in a second duct is made equivalent to half the wavelength mentioned above.

(1-3) For example, in the second cooling air flow path through the second fan unit in the intermediate part of the apparatus, a second duct unit including two or more ducts is disposed in the middle of the path, and the difference in the flow path length is provided by the pair of ducts in the same manner as described above. For example, the first and second duct units are disposed on the outer sides of the storage device box and the logic board box, that is, on the front and rear surfaces and on the right and left surfaces thereof.

(2) As a second configuration, that is, as a configuration with the improved fans, the configuration of a low noise fan in which phase-inverted sounds are produced and synthesized based on a difference in the arrangement angle of a group of blades in the fans is provided. According to the second configuration, for example, in the fans in a fan unit at the position where noise measures are required, the blades are arranged to form two-stage configuration of an upper stage and a lower stage. In this configuration, phase inverted sounds are produced and synthesized based on a phase difference at rotation generated by the difference in arrangement angle to the axis between the blades on one side and those on the other side.

(3) As a third configuration, that is, as a configuration using a plurality of fans and control means thereof, generated sounds are detected by a microphone (sensor) located between a first fan (reference fan) and a second fan (subordinate fan), and rotation timing of at least one of the first and the second fans is controlled so that the phase-inverted sounds are synthesized. According to the third configuration, for example, in the two fans to be a pair in accordance with a positional relation in a fan unit, a number of rotations (rotation speed) and rotation timing of the second fan are controlled by a first control unit by changing the driving voltage based on the sounds detected by a microphone at an intermediate position between both fans and the states of the number of rotations of each fan so that sounds generated by the other second fan (subordinate fan) become the phase inverted sounds for the sounds generated by one first fan (reference fan). The positional relation between the fans includes an adjacent arrangement and others related to the sound synthesis.

Moreover, for example, the number of rotations of the first fan (reference fan) is controlled by a second control unit such as massive arrays of inactive disks (MAID) and temperature detection provided in the apparatus. Following the control, the second fan (subordinate fan) is controlled by the first control unit mentioned above.

(4) As a fourth configuration, that is, as a configuration using a plurality of fans and control means thereof, the configuration for active noise control (ANC) is provided, in which generated sounds are detected by microphones (sensors) located between a plurality of fans, and sound signals are generated through digital signal processing and amplification processing and outputted from speakers so that phase-inverted sounds are synthesized. In this manner, the sounds are directly controlled. The fourth configuration is characterized by comprising a fan unit having an ANC function. The microphones and the speakers are provided at, for example, intermediate positions between a plurality of fans in a fan unit. By a third control unit, generated sounds by a plurality of fans are detected and inputted by the microphones, and sound signals are generated through digital signal processing and amplification processing and then outputted from the speakers so as to be synthesized with the generated sounds, thereby obtaining the state where phase-inverted sounds are synthesized.

(5) As a fifth configuration, in addition to the above-described configurations, noise insulation materials or noise absorbing materials (cover, door, rack, frame, and others) are provided at the positions where noise measures are required (locations where noises generated by the fans are leaked), especially around the fan units and the ducts and on the front and rear surfaces and the right and left surfaces of a chassis. For example, a cover which covers the apparatus is provided outside a storage device box and a logic board box, especially, through the first and the second duct units. As a cooling air flow path in the apparatus, air is taken in from the lower side of the apparatus and exhausted from the upper side of the apparatus.

The effects obtained by typical ones of the inventions disclosed in this application will be briefly described below. According to an aspect of the present invention, noises caused by a fan can be prevented and reduced while securing the cooling performance of the whole apparatus in the relatively large disk array apparatus in which high density mounting and cooling performance are taken into consideration. Furthermore, since high powered fans can be installed in the apparatus owing to the effects of fan noise reduction, cooling performance can be improved, and greater customer satisfaction can be achieved by the noise reduction. For example, it becomes possible to use a high powered fan which has not met noise specifications so far, and the operation speed improvement and the capacity increase of the apparatus can be expected.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

As a feature of the embodiments, in a cooling method using fans in a comparatively large disk array apparatus (redundant array of inexpensive disk (RAID) apparatus), a noise reduction structure using the synthesis of phase-inverted sounds (first means) is provided. The embodiments have different specific configurations for the synthesis of phase-inverted sounds (first means).

<Example of Conventional Technology>

Figure 14:
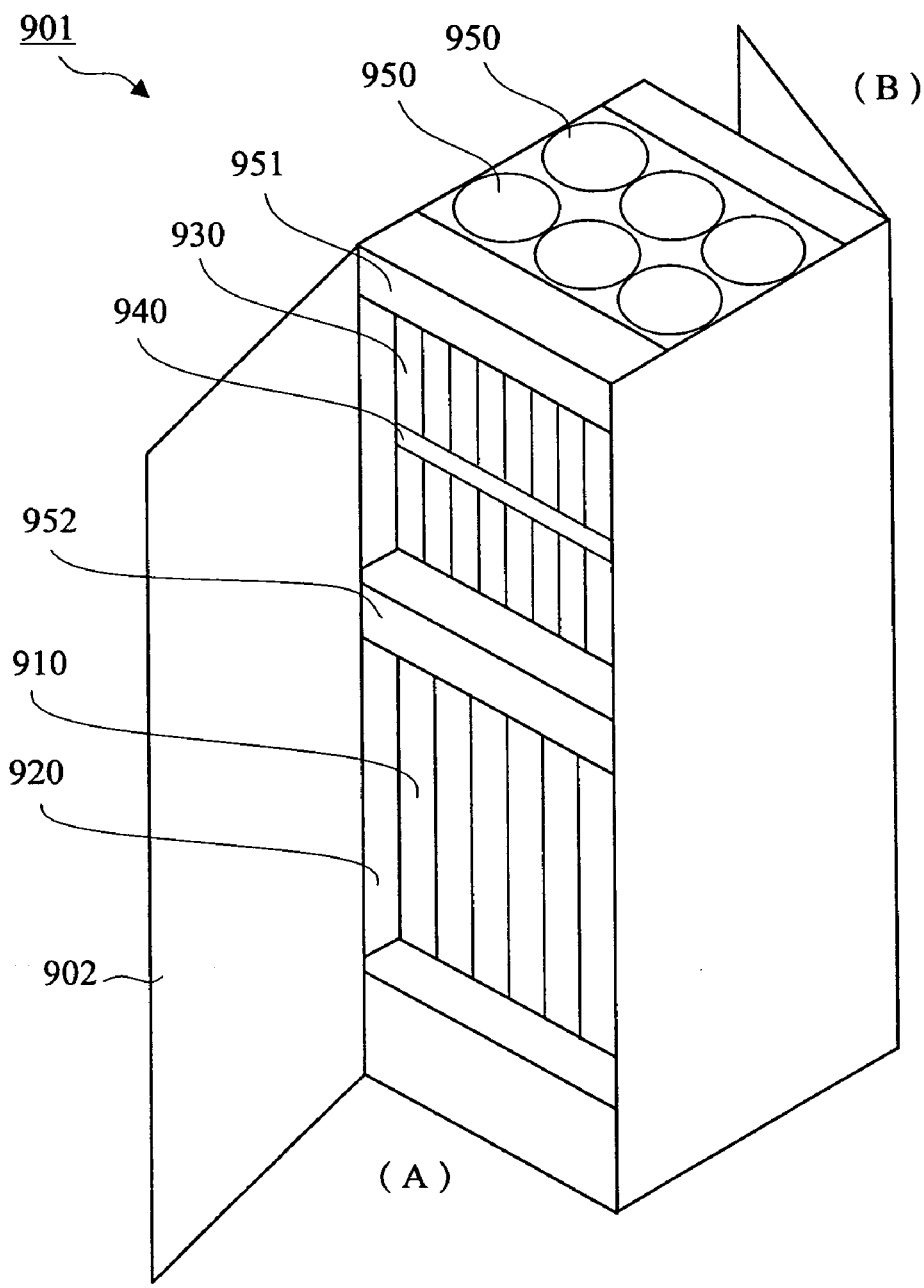
FIG. 14 is a diagram schematically showing a whole hardware configuration of a disk array apparatus according to a conventional technology.

In order to easily describe the embodiments according to the present invention, a disk array apparatus according to an example of a conventional technology which is the background of the embodiments of the present invention will be briefly described with reference to FIG. 14. A disk array apparatus 901 has openings in a front surface (A) and a rear surface (B) thereof and a door 902 with ventilation holes is provided thereto. The apparatus 901 has a logic box 920 substantially on the lower half side in which a module group of logic boards (control packages) 910 is installed and a HDD box 940 substantially in the upper half side in which a module group of HDDs 930 is installed. A fan unit 951 including a plurality of fans 950 is disposed on the upper part of the apparatus 901. Further, a fan unit 952 is disposed between the logic box 920 and HDD box 940 in the intermediate part of the apparatus 901. Both the fan units (951 and 952) become noise sources.

Since no components are disposed on the upper fan unit 951 and the fans 950 are exposed to the outside, the noises caused by the fans 950 are directly radiated to the outside (even if a perforated cover is provided thereon, the cover does not have the noise insulation and soundproofing properties). Moreover, the noises caused by the fan unit 952 in the intermediate part are also radiated to the outside through the door 902 because the door 902 has holes formed therein in order to secure the air intake for the HDD box 940 and others.

First Embodiment

A disk array apparatus according to a first embodiment of the present invention will be described with reference to FIG. 1 to FIG. 5.

<Outlines>

The first embodiment is characterized in that, as a noise reduction configuration for fan units 151 and 152 using the synthesis of phase-inverted sounds (first means), the following noise reduction structures are provided, that is: (1) a noise reduction structure using an exhaust duct 3 in the uppermost part G (corresponding to a first cooling air flow path and the first fan unit 151); (2) a noise reduction structure using a first side duct unit 4 in the lower half part B (corresponding to the first cooling air flow path and the first fan unit 151); and (3) a noise reduction structure using a second side duct unit 5 in the upper half part A (corresponding to a second cooling air flow path and the second fan unit 152). Further, the structure (4) is also provided, in which a noise insulation cover 2 is disposed on the outermost periphery of a chassis, and air is taken in from the bottom side of the apparatus and is exhausted from the upper surface side thereof.

Figure 1:
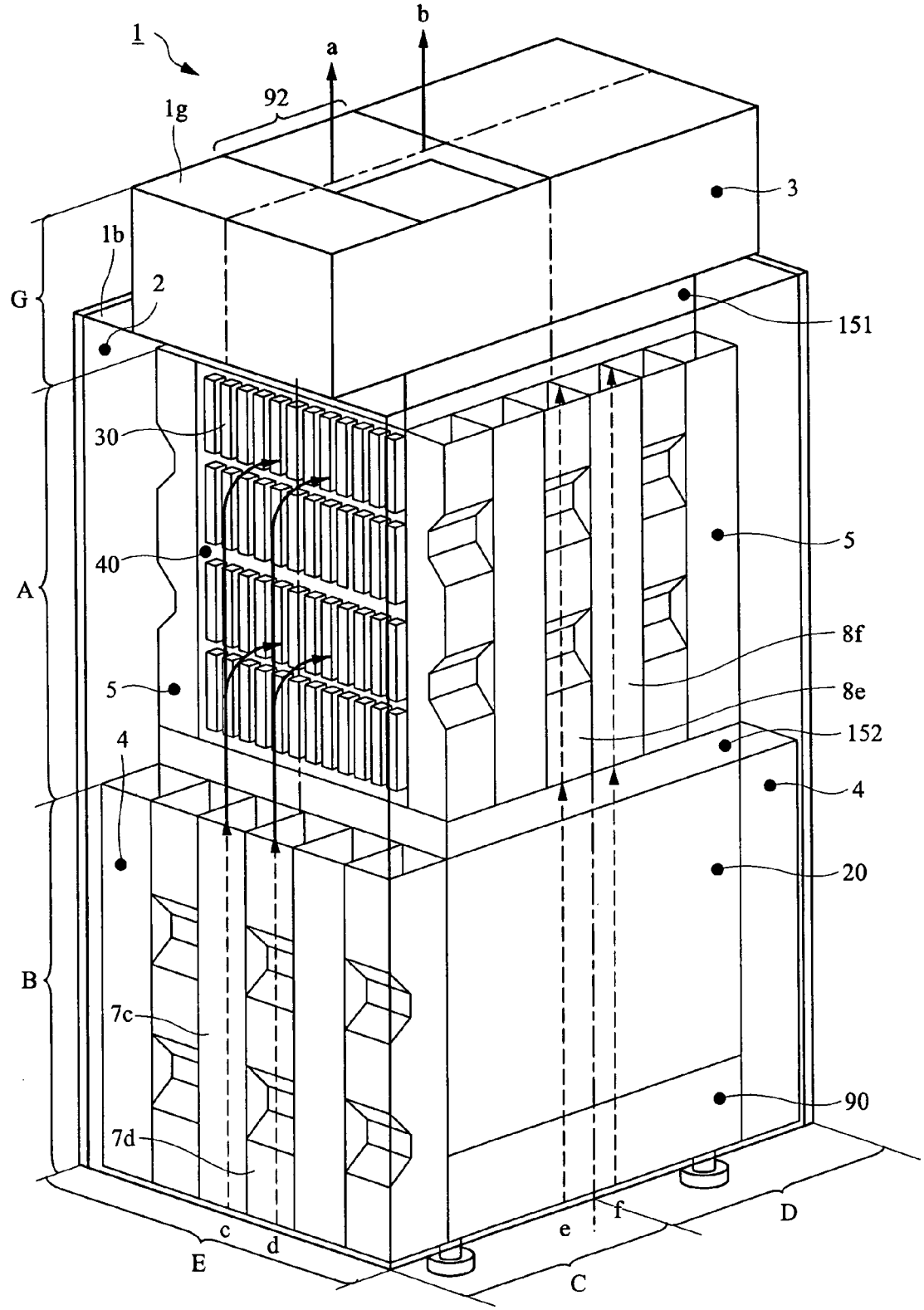
FIG. 1 is a perspective view schematically showing a hardware configuration of the whole disk array apparatus according to a first embodiment of the present invention.
Figure 2:
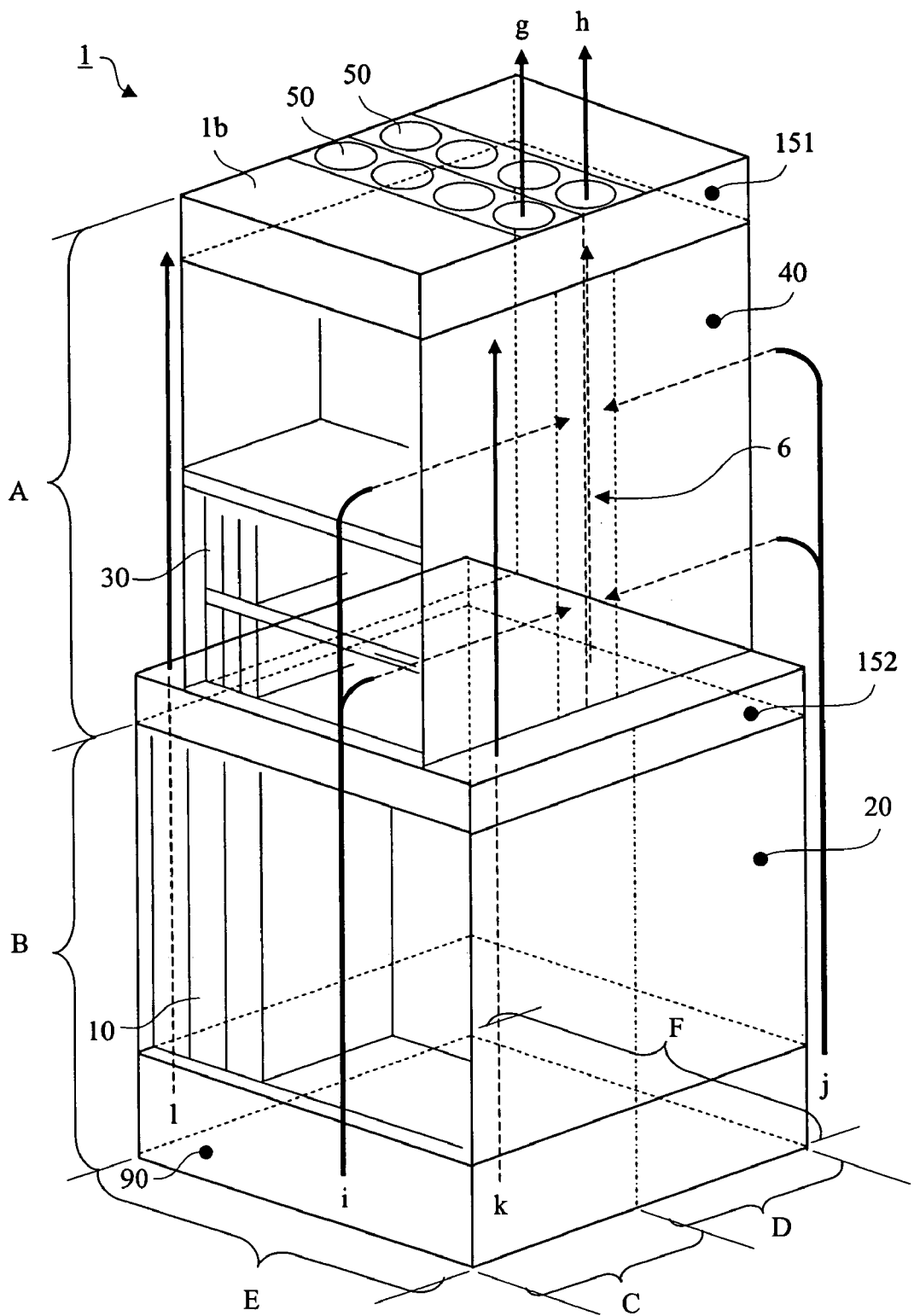
FIG. 2 is a perspective view showing a hardware configuration of a main body in the disk array apparatus according to the first embodiment of the present invention.
Figure 3:
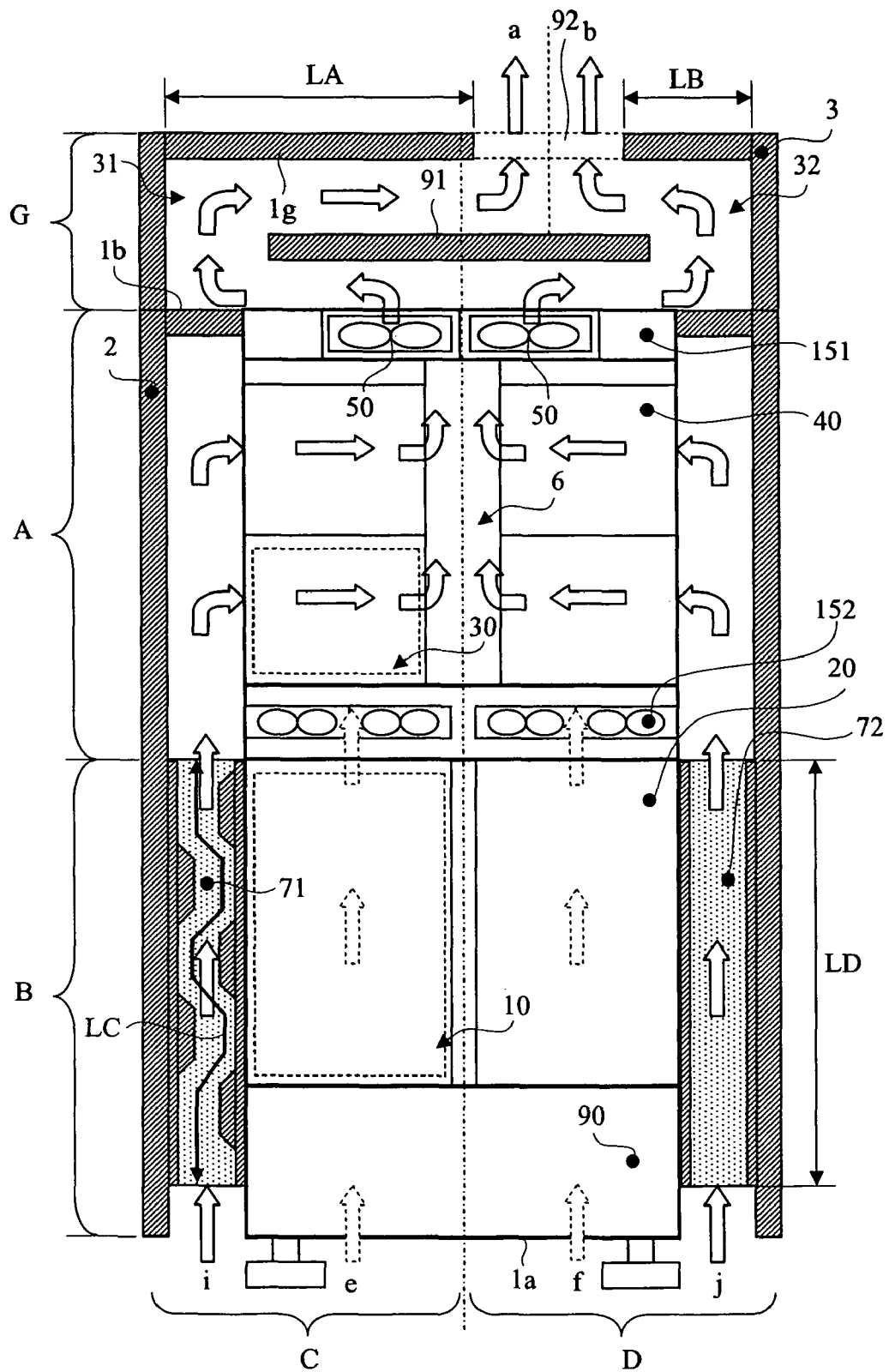
FIG. 3 is a sectional view showing the section in the front and rear direction and cooling air flow paths in the disk array apparatus according to the first embodiment of the present invention.
Figure 4:
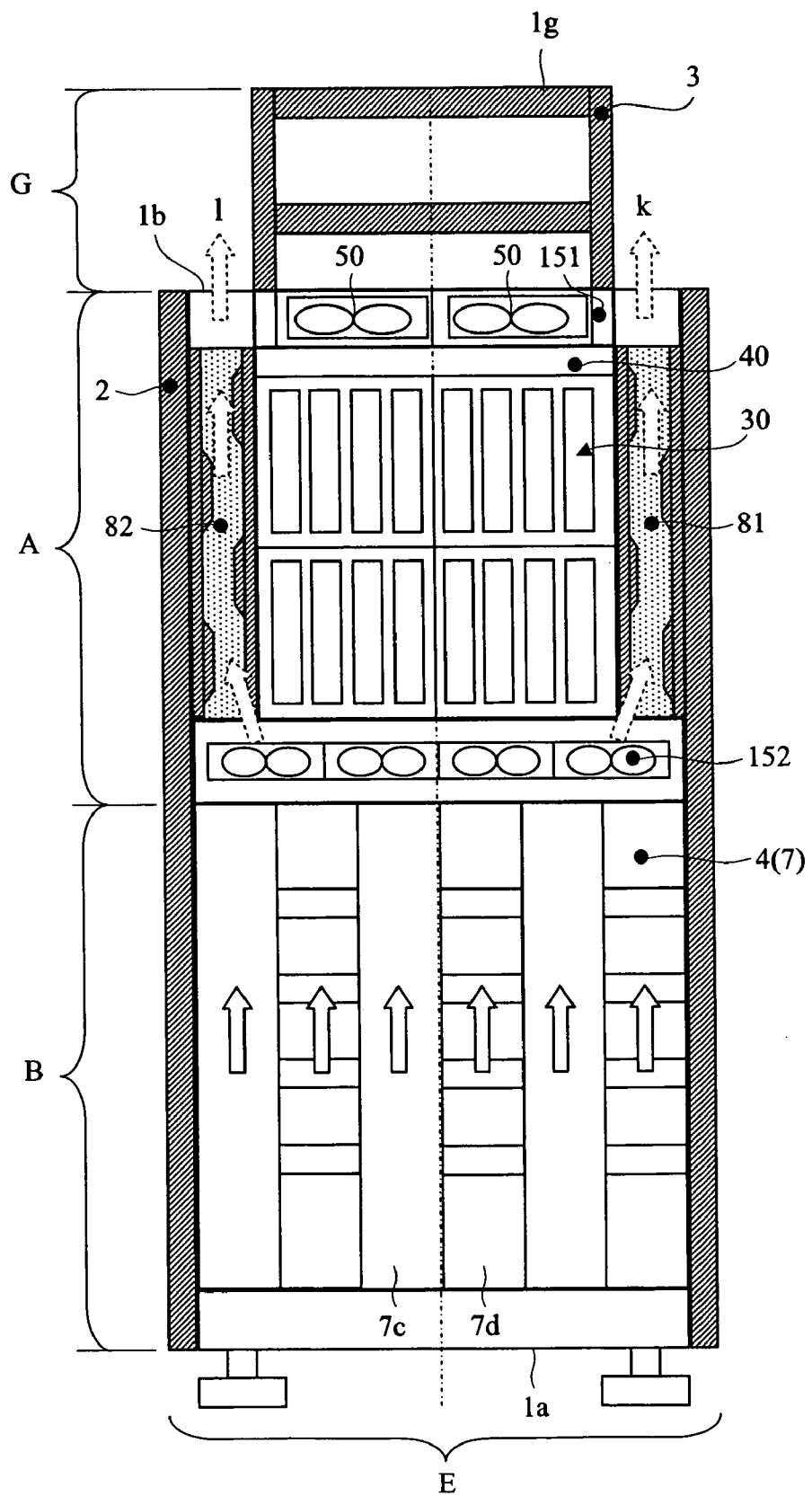
FIG. 4 is a sectional view showing the front and rear surfaces, the section in the right and left direction, and the cooling air flow paths in the disk array apparatus according to the first embodiment of the present invention.

FIG. 1 and FIG. 2 show a general appearance of the disk array apparatus 1 according to the first embodiment. FIG. 3 and FIG. 4 show a cross sectional structure of the disk array apparatus 1 according to the first embodiment. Moreover, a part of the cooling air flow path is shown by arrows. The apparatus has the configurations described in the following paragraphs (1) to (4) in general.

(1) The exhaust duct 3 is added further on the first fan unit 151 in the upper part of the apparatus. By the internal structure of the exhaust duct 3, an upward exhaust flow (flow path) from the fans 50 in the fan unit 151 is divided into two flow paths, and the difference in the length between the two flow paths is adjusted to a predetermined characteristic (half of the wavelength of a specific frequency of the fan 50) corresponding to a fan characteristic and a noise reduction principle (described in detail with reference to FIG. 7 and FIG. 8). By this means, in the exhaust flow from the fan unit 151, a sound whose phase is inverted is synthesized with the sound with the specific frequency corresponding to a noise element of the fans 50, thereby reducing the noise.

(2) Further, on the cooling air flow path (first cooling air flow path) for the whole apparatus including the first fan unit 151, a duct unit having a plurality of ducts whose air flow paths are adjusted in the same manner as that of the exhaust duct 3 is disposed in addition to the exhaust duct 3. Specifically, a first side duct unit 4 including a pair of ducts having different air flow path lengths is disposed on the front and rear surfaces of the logic box 20 in the lower half part B. By this means, in exhaust flow from the pair of ducts in the first side duct unit 4, the phase-inverted sounds are synthesized, and the noises are reduced.

(3) Further, also on the cooling air flow path (second cooling air flow path) for the whole apparatus including the intermediate second fan unit 152, a duct unit having a plurality of ducts whose air flow paths are adjusted is disposed in the same manner as that of the above-described configuration (2). Specifically, a second side duct unit 5 including a pair of ducts having different air flow path lengths is disposed on the left and right surfaces of the HDD box 40 in the upper half part A. By this means, in exhaust flow from the pair of ducts in the second side duct unit 5, the phase-inverted sounds are synthesized, and the noises are reduced.

(4) Further, as an air intake structure for a group of HDDs 30 (HDD box 40) in the upper half part A, the cooling air from the lower half part B (first-side duct unit 4) is taken in the upper half part A. By this means, in the apparatus 1, a component where the noise measures are required (noise radiating component or noise transmission component) such as the second fan unit 152 can be covered with the noise insulation cover 2 with no or a small number of opening holes. Accordingly, the noise reduction effect can be achieved.

<Apparatus Configuration>

An external appearance configuration of the whole apparatus 1 including ducts and the like will be described with reference to FIG. 1. The outermost periphery of the apparatus 1 is covered with the cover 2. Inside the cover 2, the first upper fan unit 151, the HDD box 40 in which the module group of the HDDs 30 is installed, and the intermediate second fan unit 152 are located in the substantially upper half part A. Further, the logic box 20 in which a module group of logic boards 10 are installed and a power source unit 90 are located in the substantially lower half part B. Moreover, the first side duct unit 4 is disposed between the cover 2 and each of the front and rear surfaces of the logic box 20, and the second side duct unit 5 is disposed between the cover 2 and each of the right and left side surfaces of the HDD box 40. Also, the exhaust duct 3 is located in the uppermost part G on the first fan unit 151. The front part C and the rear part D of the apparatus 1 have the same configuration.

In the first side duct unit 4, a plurality of ducts (each six ducts in this embodiment) extending in the vertical direction are arranged in the right and left direction on each of the front and rear surfaces of the logic box 20. The ducts adjacent to each other in the right and left direction (for example, 7c and 7d) form one pair. Two types of ducts (7c and 7d) with different flow path lengths are alternately arranged. Also, two ducts at corresponding positions form one pair even on the front and rear surfaces of the logic box 20. Similarly, in the second side duct unit 5, a plurality of ducts (each six ducts in this embodiment) extending in the vertical direction are arranged in the front and rear direction on each of the right and the left side surfaces of the HDD box 40. Ducts adjacent to each other in the front and rear direction (for example, 8e and 8f) form one pair.

A solid line arrow denotes a cooling air flow outside the boxes, the ducts, and others, and a dotted line arrow denotes a cooling air flow inside the boxes, the ducts, and others. Reference characters a and b denote a pair of exhausts from an exhaust port 92 of the exhaust duct 3. Reference characters c and d denote a pair of cooling airs, which flow into the HDD box 40 through the pair of the ducts 7c and 7d in the first side duct unit 4 on the first cooling air flow path and are taken into the first fan unit 151. Reference characters e and f denote a pair of cooling airs, which are taken into the second fan unit 152 through the logic box 20 on the second cooling air flow path and are exhausted to the outside through the pair of the ducts 8e and 8f in the second side duct unit 5.

A reference character 1b denotes an upper surface of the main body of the apparatus 1 and it corresponds to the upper surface of the first fan unit 151 in the upper half part A. A reference character 1g denotes an upper surface of the exhaust duct 3 in the uppermost part G.

The external appearance configuration of the main body of the present apparatus 1 except for the ducts and others will be described with reference to FIG. 2. A front surface E and a rear surface F of the main body of the apparatus 1 serve as the openings for the insertion and removal of modules of the HDD 30 in the HDD box 40 and the logic boards 10 in the logic box 20. The first fan unit 151 installs a plurality of fans 50 (four fans in each of the front and the rear portions, that is, eight fans in total in FIG. 2). Similarly, the second fan unit 152 installs a plurality of fans 50. A backboard, a center duct 6, and others (not shown) are provided in the vicinity of the boundary between the front part C and the rear part D.

Reference characters g and h denote upward exhausts from a pair of fans 50 in the first fan unit 151 on the first cooling air flow path. Reference characters i and j denote a pair of cooling airs, which flow into the HDD box 40 through the front and rear surface sides of the logic box 20 (first side duct unit 4) on the first cooling air flow path and pass upward through the center duct 6 and then are taken into the first fan unit 151. The reference character i denotes the cooling air on the side of the front surface, and the reference character j denotes the cooling air at a position corresponding to that of i on the rear surface. The center duct 6 extending in the vertical direction is located at the center of the HDD box 40. Reference characters k and denote a pair of cooling airs, which pass through the inside of the logic box 20, the second fan unit 152, and the right and left surface sides of the HDD box 40 (second side duct unit 5) on the second cooling air flow path and are then exhausted to the outside. The reference character k denotes the cooling air on the right surface side, and l denotes the cooling air at a position corresponding to that of k on the left surface side.

In the logic box 20, a plurality of modules of the logic board 10 can be installed onto the backboard. In the HDD box 40, a plurality of modules of the HDD 30 can be installed onto the backboard. The logic box 20 and the HDD box 40 can be further divided into a plurality of regions. Moreover, a plurality of boxes can be placed on top of each other in the same manner as that of a well-known technology. The power source unit 90 is provided in the lowermost part. The power source unit 90 is configured of a plurality of AC/DC power sources, batteries, and others corresponding to a redundant configuration. The DC power is supplied from the power source unit 90 to the logic box 20, the HDD box 40, the fan units 151 and 152, and others.

FIG. 3 and FIG. 4 are cross sectional views showing cooling air flow paths in the apparatus 1. FIG. 3 shows a cross section of the apparatus 1 in the front and rear direction, and FIG. 4 shows a cross section of the apparatus 1 in the right and left direction and the front surface E thereof.

The first cooling air flow paths (shown by solid line arrows) corresponding to the first fan unit 151 will be described below. As shown in the whole of FIG. 3 and in the lower half part B of FIG. 4, the air (i and j) are taken in from the side of the bottom surface 1a of the apparatus 1 through ducts (71 and 72) in the first side duct unit 4 on the front and rear surfaces of the logic box 20 in the lower half part B by the operation of the first fan unit 151 in the upper part of the apparatus 1. Then, the cooling air flows into the upper half part A from the first side duct unit 4 and flows into the inside of the HDD box 40 from the opening thereof, and then passes through the HDDs 30 to cool them. Thereafter, the cooling air passes from the rear side of the HDD 30 in the HDD box 40 to the center duct 6 inside the box, and passes upward through the center duct 6 and is then taken into the first fan unit 151. Further, the upward exhausts from the first fan unit 151 pass through flow paths 31 and 32 which are separated from each other in the exhaust duct 3, are joined together at the exhaust port 92, and are then exhausted to the outside (a and b).

The second cooling air flow path corresponding to the second fan unit 152 (shown by dashed line arrows) will be described below. As shown in the lower half part B in FIG. 3 and in the upper half part A in FIG. 4, cooling air is taken in from the side of the bottom surface 1a, passes through the power source unit 90 and the logic box 20 in the lower half part B to cool them, and is taken into the second fan unit 152 by the operation of the second fan unit 152 in the intermediate part of the apparatus 1. Thereafter, as shown in FIG. 4, the cooling air is exhausted upward from the second fan unit 152 through the ducts (81 and 82) in the second side duct unit 5 on the right and left side surfaces of the HDD box 40 in the upper half part A (k and l).

<(1) Exhaust Duct>

The configuration of the exhaust duct 3 connected to the upper surface 1b of the apparatus 1 on the first cooling air flow path will be described below with reference to FIG. 3 and FIG. 5. In the internal structure of the exhaust duct 3, a flow path from the exhaust port (exit) of the fan 50 in the first fan unit 151, that is, the intake port (entrance) of the exhaust duct 3 to the exhaust port 92 (exit) in the upper surface 1g of the exhaust duct 3 is divided into two flow paths 31 and 32 by a partition plate 91 and others. There are the flow path 31 (exhaust a) from the fan 50 on the side of the front part C of the apparatus 1 to the exhaust port 92 and the flow path 32 (exhaust b) from the fan 50 on the side of the rear part D of the apparatus 1 to the exhaust port 92. In the vicinity of the exhaust port 92, the cooling airs of the two flow paths 31 and 32 are joined together, and the sounds thereof are synthesized.

The pair of the flow paths 31 and 32 are adjusted and designed so that they have different flow path lengths from each other and the difference in the flow path length satisfies a predetermined characteristic. When the flow path length of the (longer) flow path 31 is assumed to be A and the flow path length of the other (shorter) flow path 32 is assumed to be B, the difference in the flow path length is made equivalent to half ($\lambda/2$) the wavelength ($\lambda$) of a specific frequency of the fan 50, that is: $(A-B)=\lambda/2$. In this embodiment, the difference in the flow path length (A–B) in the exhaust duct 3 can be roughly calculated using lengths LA and LB from the ends of the upper surface 1g in the front and rear direction to the exhaust port 92. That is, (LA–LB) is nearly equal to $\lambda/2$.

Figure 5:
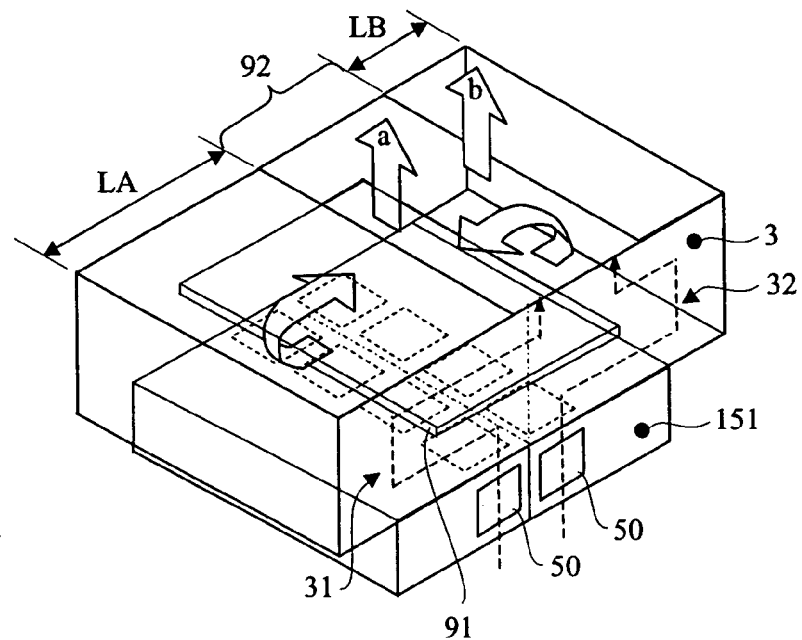
FIG. 5 is a perspective view showing a configuration of an exhaust duct at the uppermost part of the disk array apparatus according to the first embodiment of the present invention.

FIG. 5 shows a first configuration example of the exhaust duct 3. In the exhaust duct 3, the two flow paths 31 and 32 are formed by the design of the center partition plate 91 in the horizontal direction and the position of the exhaust port (opening) 92 in the upper surface 1g. The flow paths 31 and 32 extend from the exhaust port of each fan 50 in the first fan unit 151 to the exhaust port 92 in the upper surface 1g. The first configuration example is a simple configuration, and the exhaust from a plurality of the fans 50 in the first fan unit 151 is roughly divided into two.

<(2) First Side Duct Unit>

Moreover, in the lower half part B in FIG. 1, a pair of the ducts 7 (for example, 7c and 7d) corresponding to each other in accordance with a positional relation on the front surface E (similarly on the rear face F) of the logic box 20 in the first side duct unit 4 on the first cooling air flow path are adjusted and designed so that they have different flow path lengths from each other and the difference in the flow path length satisfies a predetermined characteristic. When the flow path length of the (longer) duct 7c of the pair of ducts (7c and 7d) is assumed to be LC and the flow path length of the other (shorter) duct 7d thereof is assumed to be LD, the difference in the flow path length is made equivalent to half ($\lambda/2$) the wavelength ($\lambda$) of a specific frequency of the fan 50 in the first fan unit 151, that is: $(LC-LD)=\lambda/2$ (similar in FIG. 3).

Similarly, in the lower half part B in FIG. 3, a pair of the ducts 7 (for example, 71 and 72) in the first side duct unit 4 corresponding to each other in accordance with a positional relation on the front and rear surfaces E and F of the apparatus 1 on the first cooling air flow path are adjusted and designed so that the difference in the flow path length between the ducts 71 and 72 satisfies a predetermined characteristic. When the flow path length of the (longer) duct 71 of the pair of ducts (71 and 72) is assumed to be LC and the flow path length of the other (shorter) duct 72 thereof is assumed to be LD, the difference in the flow path length is made equivalent to half ($\lambda/2$) the wavelength ($\lambda$) of a specific frequency of the fan 50 in the first fan unit 151, that is: $(LC-LD)=\lambda/2$.

In the lower part and the bottom surface 1a of the apparatus 1 in FIG. 3, a space is provided between the ground plane and the intake port below the first side duct unit 4 in order to secure the air intake.

<(3) Second Side Duct Unit>

Further, in the upper half part A in FIG. 1, in the second side duct 5 on right and the left surfaces of the HDD box 40 on the second cooling air flow path, a pair of ducts (8e and 8f) corresponding to each other in accordance with the positional relation on the right side surface (similarly on the left side surface) of the HDD box 40 are adjusted and designed in a similar manner to the structure of the first side duct unit 4 described above so that the difference in the flow path length between the ducts (8e and 8f) satisfies a predetermined characteristic. That is, the difference in the flow path length between one (longer) duct 8e and the other (shorter) duct 8f in the pair of ducts (8e and 8f) is made equivalent to half ($\lambda/2$) the wavelength ($\lambda$) of a specific frequency of the fan 50 in the second fan unit 152.

In the pairs of ducts in the first side duct unit 4 and the second side duct unit 5, for example, one duct has a straight shape and the other duct has a zigzag shape by the concaves and convexes. Further, each of the side duct units 4 and 5 is configured to be freely detachable form the main body.

Also, the first side duct unit 4 and the second side duct unit 5 can be understood to have the structure that the inside thereof is divided into a plurality of flow paths extending in the vertical direction by a plurality of partition plates.

<(4) Cover>

In FIG. 1, FIG. 3, and FIG. 4, as the air intake to the HDD box 40 in the upper half part A on the first cooling air flow path, the cooling air having passed through the first side duct unit 4 in the lower half part B is taken in from the front and rear surfaces of the HDD box 40. Further, as the air intake to the logic box 20 in the lower half part B on the second cooling air flow path, the cooling air is taken upward from the bottom surface 1a and then taken into the second fan unit 152. The first side duct unit 4 is disposed on the front and rear surfaces in the lower half part B, and the second side duct unit 5 is disposed on the right and left side surfaces in the upper half part A. Accordingly, noise insulation effect can be obtained in apparatus 1 because the outer periphery (front, rear, right and left surfaces) of the apparatus 1 including a component where the noise measures are required such as the second fan unit 152 and excluding the exhaust duct 3 can be covered with the noise insulation cover 2 having a substantially rectangular parallelepiped shape. Since the cover 2 has openings in the bottom surface 1a and the upper surface 1b of the apparatus 1 but does not have any opening in the front, rear, right and left surfaces, the noise insulation can be achieved. Moreover, the cover 2 has an openable and closable structure in the form of a door or the like for the insertion/removal and the maintenance of the modules through the front and rear surfaces. In the apparatus 1, the cooling efficiency is not reduced even if the cover 2 is provided because the structure of the cooling air flow paths is totally considered.

Here, it is not always necessary to provide all of the above-described duct structures (1), (2) and (3), but the configuration having some of them is also available. In both cases, a reasonable effect can be achieved.

According to the first embodiment, a noise reduction effect is obtained for each of the fan units 151 and 152 while maintaining the cooling performance over the whole apparatus 1, and radiation and transmission of noises from the upper surface and the outer periphery (front, rear, left and right surfaces) of the apparatus 1 can be suppressed. Further, high power fans can be adopted for the fans in the fan units 151 and 152.

Second Embodiment

Next, a disk array apparatus 1 according to a second embodiment of the present invention will be described with reference to FIG. 6. The second embodiment has a basic configuration similar to that of the first embodiment, and the feature of the second embodiment lies in the noise reduction structure using an exhaust duct 3 in the uppermost part G, in which a cooling air flow path is divided into a plurality of paths by partition plates 93.

Figure 6:
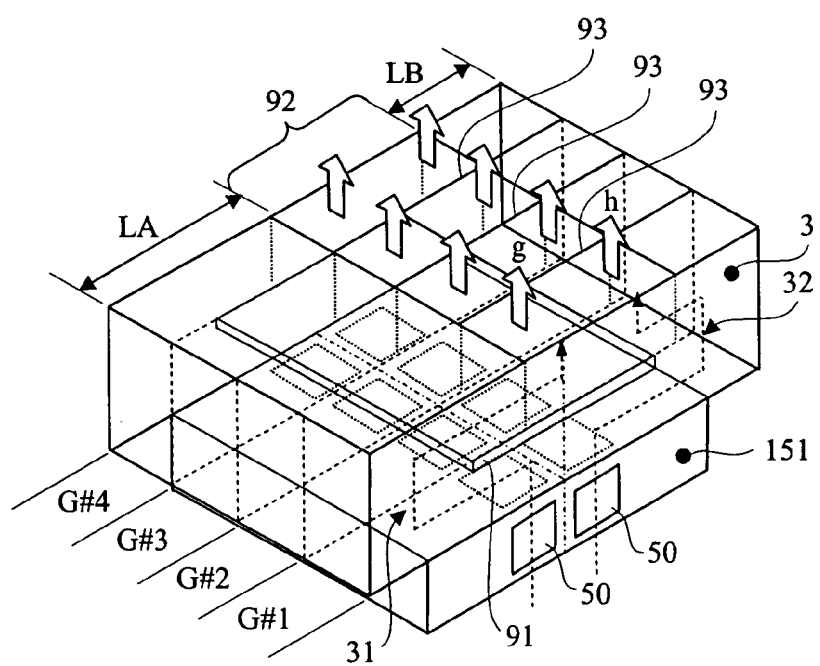
FIG. 6 is a perspective view showing a configuration of an exhaust duct at the uppermost part of a disk array apparatus according to a second embodiment of the present invention.

In FIG. 6, as a second configuration example of the exhaust duct 3, the inside of the exhaust duct 3 is divided into a plurality (four in the this embodiment) of similar spaces and flow paths by a plurality (three in this embodiment) of partition plates 93. The first fan unit 151, the partition plate 91 in the horizontal direction and the exhaust port 92 have the same configurations as those of the first configuration example shown in FIG. 5. The partition plate 93 has a rectangular shape with the same size as that of the side surface of the exhaust duct 3 in the vertical direction, and it closes the air flow in the right and left direction in the exhaust duct 3. The exhaust port 92 is divided into a plurality (four) of small exhaust ports by the partition plates 93. The regions and the flow paths divided by the partition plates 93 correspond to the arrangement and the number of a plurality (for example, four pairs) of fans 50 in the fan unit 151. More specifically, in the fan unit 151 of this embodiment, each four fans 50 are arranged in the right and left direction at equal intervals so as to correspond to the front part C and the rear part D, and the paired fans 50 are disposed in the front and rear direction. Corresponding to the configuration described above, the flow path in the exhaust duct 3 is divided into four paths by the partition plates 93.

In the configuration having the divided regions and flow paths, a sectional area for a wavelength ($\lambda$) of a specific frequency of the fan 50 becomes small, and plane waves can be acquired as sound waves. Since the plane waves are joined in each flow path, the synthesis of phase-inverted waves is remarkably conducted, and thus a significant noise reduction effect can be achieved.

More particularly, in this configuration, a plurality of logic boards 10, HDDs 30, fans 50, and cooling air flow paths (ducts) and the like in the apparatus 1 are divided into a plurality of groups (G) in accordance with the positional relation. The pair of fans 50 is associated with the group (G). In FIG. 6, four regions divided by the partition plates 93 and pairs of fans 50 are associated with the groups G#1 to G#4.

Also, the second configuration example of the exhaust duct 3 can be understood to have the structure that the inside thereof is divided into a plurality of ducts by the partition plates 93. Further, as a variation of the second configuration example of the exhaust duct 3, the configuration in which a part of the partition plates 93 with a rectangular shape is removed to connect the flow paths inside the exhaust duct 3 in the right and left direction is also acceptable (intermediate form between the first configuration example and the second configuration example).

<Fan Noise Characteristic and Noise Reduction Principle>

Figure 7:
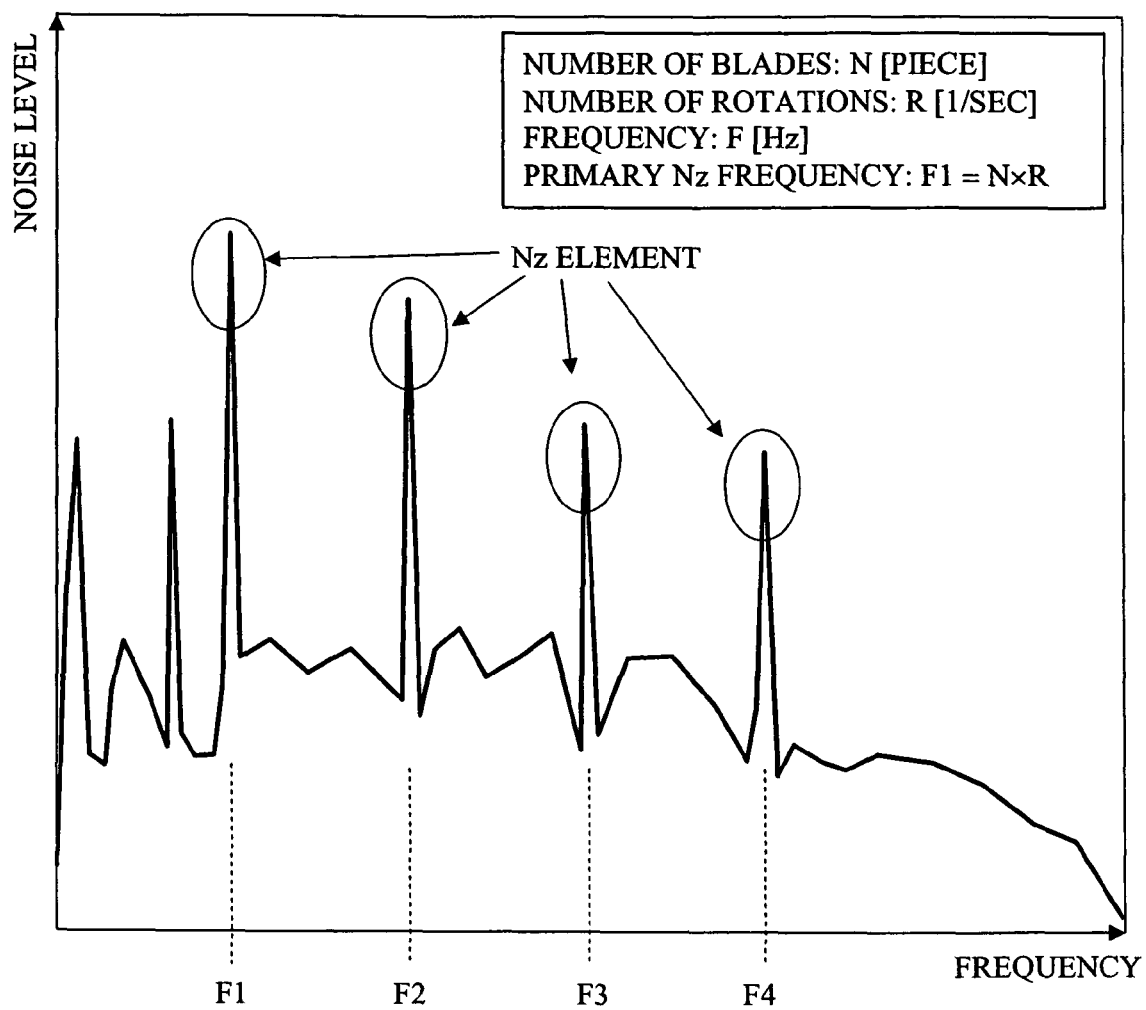
FIG. 7 is a graph showing the noise characteristics (frequency-noise level) of a fan in a disk array apparatus according to an embodiment of the present invention.

Next, FIG. 7 shows a noise characteristic of the fan 50 provided in the fan units 151 and 152. In the fan 50, a peak (noise (Nz) element) of the noise level appears at a specific (inherent) frequency (for example, F1 to F4) according to the number of rotations and the number of blades thereof. In general, when it is assumed that the number of blades: N [pieces], the number of rotations: R [1/sec], and the frequency: F [Hz], the highest peak appears at the frequency F1 (F1=N×R). This frequency F1 is referred to as a primary Nz frequency. Similarly, Nz elements such as a secondary Nz frequency (F2) and subsequent Nz frequencies are present.

Based on the above-described specific frequency (F) and the wavelength ($\lambda$) thereof, characteristics of the cooling air flow paths and others in the configurations of each of the embodiments are designed. In particular, based on the primary Nz frequency (F1) with the highest noise level, the characteristics are uniformly designed so that the above-described difference in the flow path length becomes equivalent to half the wavelength ($\lambda/2$). A plurality of pairs of fans 50 are uniformly configured so as to correspond to the primary Nz frequency (F1).

Figure 8A:
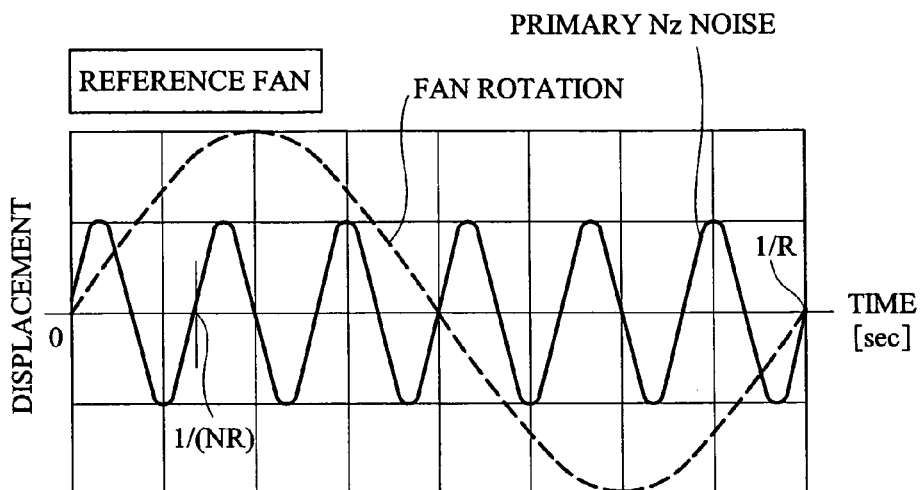
FIG. 8A is a graph showing waveforms of fan rotations and noises (time-displacement) of a reference fan for describing a noise reduction principle in a disk array apparatus according to an embodiment of the present invention.
Figure 8B:
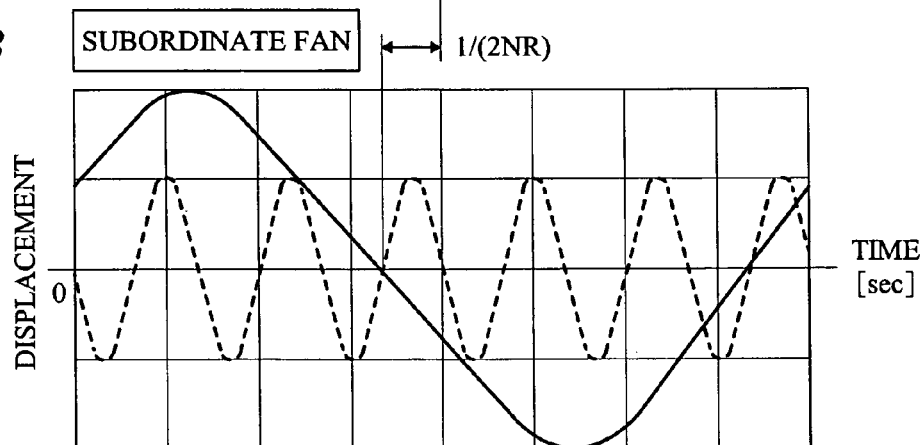
FIG. 8B is a graph showing waveforms of fan rotations and noises (time-displacement) of a subordinate fan for describing a noise reduction principle in a disk array apparatus according to an embodiment of the present invention.
Figure 8C:
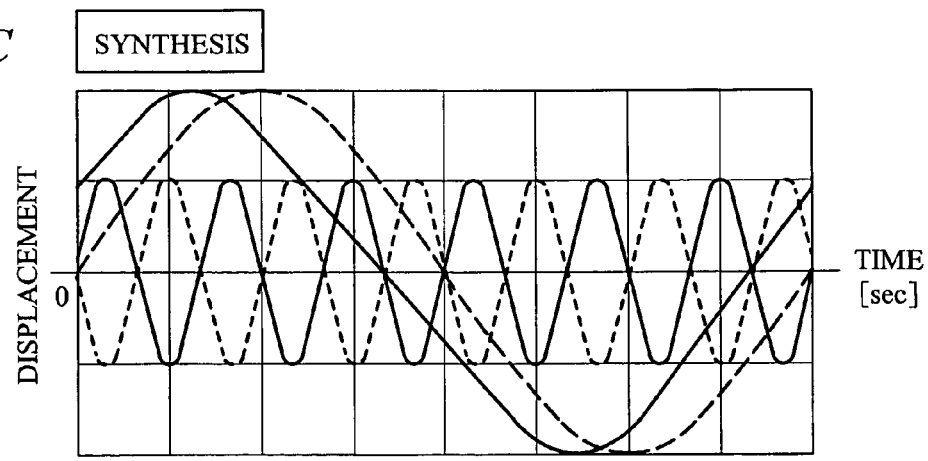
FIG. 8C is a graph showing waveforms of fan rotations and noises (time-displacement) in the case where sounds of the reference fan and those of the subordinate fan are synthesized, for describing the noise reduction principle in a disk array apparatus according to an embodiment of the present invention.

Moreover, FIG. 8A to FIG. 8C show a noise reduction principle using the phase inversion. FIG. 8A shows a fan rotation and noise waveform of a reference fan, FIG. 8B shows a fan rotation and noise waveform of a subordinate fan (adjustment fan) related to (paired with) the reference fan, and FIG. 8C shows synthesized contents between the reference fan (FIG. 8A) and the subordinate fan (FIG. 8B). FIG. 8A to FIG. 8C are two-dimensionally expressed by the time [sec] and displacement.

FIG. 8A shows the displacement based on time of the fan rotation and primary Nz noise of the reference fan (first fan 50). The wavelength is 1/R in the waveform of the fan rotation. On the other hand, the wavelength is 1/(NR) in the waveform of the primary Nz noise.

In FIG. 8B, the fan rotation and primary Nz noise of the subordinate fan (second fan 50) are shifted in phase by 1/(2NR) from those of the reference fan. The phase of the primary Nz noise shown in FIG. 8B is inverted from that of the primary Nz noise shown in FIG. 8A.

In the synthetic contents shown in FIG. 8C, since the primary Nz noise (original first sound wave) shown in FIG. 8A and the primary Nz noise (phase-inverted second sound wave) shown in FIG. 8B are synthesized, the primary Nz noise becomes zero as an ideal state.

Third Embodiment

Next, a disk array apparatus 1 according to a third embodiment of the present invention will be described with reference to FIG. 9. The third embodiment has a basic configuration similar to that of the first embodiment, and the feature of the third embodiment lies in that the blades are arranged to form two-stage configuration in a plurality of (at least one) fans 50 in the first fan unit 151 (or the second fan unit 152), and the noise reduction is realized by producing and synthesizing phase-inverted sounds by the two-stage configuration.

Figure 9A:
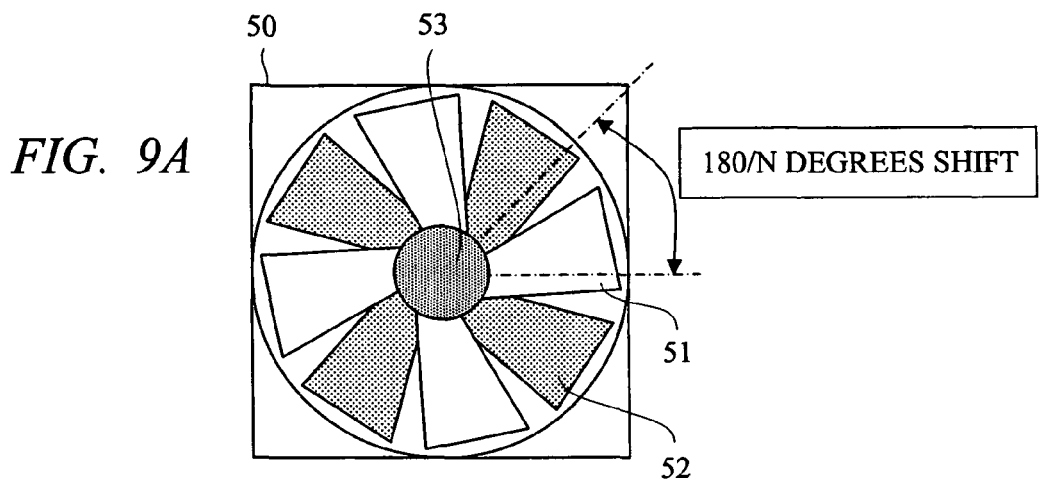
FIG. 9A is a diagram showing a configuration of a fan to be a target of the noise reduction in a disk array apparatus according to a third embodiment of the present invention.
Figure 9B:
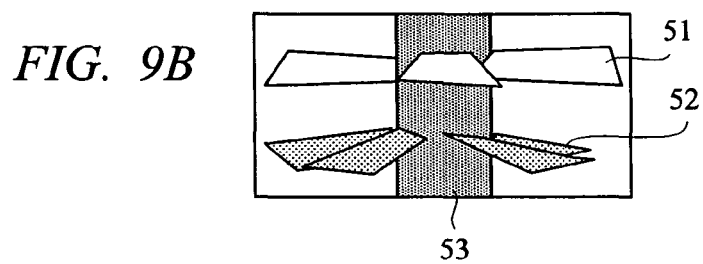
FIG. 9B is a diagram showing a configuration of a fan to be a target of the noise reduction in the disk array apparatus according to the third embodiment of the present invention.

As shown in FIG. 9A and FIG. 9B, a plurality of (N: for example, four) blades (upper-stage blades) 51 are arranged so as to be shifted by equal angles (for example, 90 degrees) to a rotation axis 53 in the upper stage, and a plurality (N: for example, four) blades (lower-stage blades) 52 are arranged so as to be shifted by equal angles (for example, 90 degrees) in the lower stage. Then, the group of the upper-stage blades 51 and the group of the lower-stage blades 52 are arranged so as, to be shifted by 180/N degrees, that is, 45 degrees in pitch in this example. N is, for example, 4, 6, 8, and others.

As described above, in the fans 50 with the two-stage configuration including the groups of blades shifted by a predetermined pitch in the upper and lower stages, sounds whose phases are inverted in relation to the primary Nz frequency are radiated depending on the pitch, and the sounds are mutually cancelled by each other. By this means, the noise reduction effect can be achieved. When the two-stage configuration described above is applied to each of the fans 50 provided in the fan units 151 and 152, a noise reduction effect can be accordingly enhanced.

Fourth Embodiment

Next, a disk array apparatus 1 according to a fourth embodiment of the present invention will be described with reference to FIG. 10 and FIG. 11. The fourth embodiment has a basic configuration similar to that of the first embodiment, and the feature of the fourth embodiment lies in that rotation timing of a pair of fans 50 in the first fan unit 151 and the like is controlled to produce and synthesize the phase-inverted sounds, thereby achieving the noise reduction.

Figure 10:
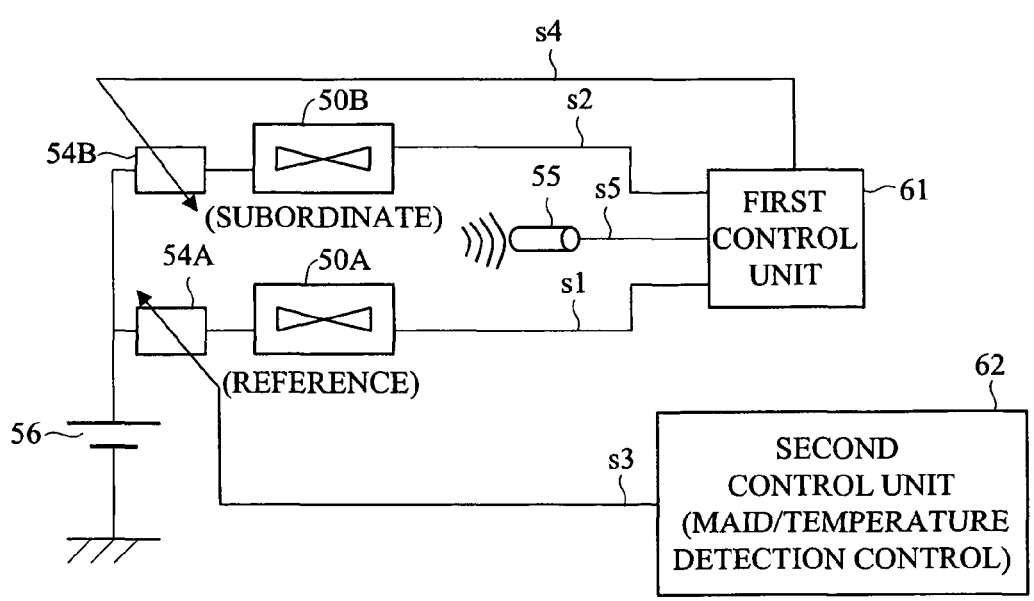
FIG. 10 is a diagram showing a configuration for controlling a fan unit in a disk array apparatus according to a fourth embodiment of the present invention.

FIG. 10 shows a characteristic configuration of the fourth embodiment. This is the mechanism in which the rotation timing of the fans 50 (50A and 50B) paired in accordance with positional relation in the first fan unit 151 is adjusted by a first control unit (controller) 61 to invert the phases of the noises, thereby reducing the noises. More specifically, in the two fans 50 to be paired, that is, one first fan (reference fan) 50A and the other second fan (subordinate fan) SOB, the rotation timing of the second fan 50B is controlled by the first control unit 61 so that a phase difference of the fan rotations becomes half the wavelength ($\lambda/2$). In this case, it is the basis of the control that the second fan (subordinate fan) 50B is rotated so as to follow the number of rotation of the first fan (reference fan) 50A to be a reference. In other words, different from the noise reduction by stopping one of the fans 50, the control does not cause the deterioration of the original function (cooling performance).

A special method is not required for the control of fan rotations, and only input of ordinary voltages (driving voltages) to the fans 50A and 50B is necessary for the control. Accordingly, an ordinary fan can be used for the control. In this control, speed control (control of the number of fan rotations and the rotation timing) of the fans 50A and 50B is performed using impedance controllers 54A and 54B. In the impedance controllers 54A and 54B connected to the fans 50A and SOB, DC voltage (fan driving voltage) supplied to the corresponding fans 50A and 50B is determined by variable impedance based on a power source voltage 56. The number of fan rotations is determined by the level of the DC voltage.

The two fans 50A and 50B are connected to the first control unit 61. The first control unit 61 recognizes the number of rotations and the rotation timing of the fans 50A and 50B by the signals of the number of rotations s1 and s2 outputted from the fans 50A and 50B to the first control unit 61.

Further, the generated sounds of the pair of the fans 50A and 50B are directly detected by a microphone 55, and detected sounds (s5) are inputted to the first control unit 61. Then, the rotations of the fans 50A and 50B are stabilized at the appropriate timing by control by the first control unit 61. In other words, the phase difference in the fan rotations of the second fan (subordinate fan) 50B to the first fan (reference fan) 50A is made equivalent to half the wavelength ($\lambda/2$). In particular, a variable impedance control signal (s4) for the timing control of fan rotations is supplied from the first control unit 61 to the impedance controller 54B of the second fan (subordinate fan) 50B.

Further, in this apparatus 1, the control described above is possible in the case where the number of rotations of the reference fan 50A is restricted and controlled based on controls of massive arrays of inactive disks (MAID) and temperature detection (well-known technology). In FIG. 10, a second control unit (MAID or temperature detection control unit) 62 for controlling the MAID and the temperature detection is provided, and the impedance controller 54A of the reference fan 50A is controlled from the second control unit 62, thereby controlling the number of rotations and operation/non-operation state of the reference fan 50A.

Figure 11:
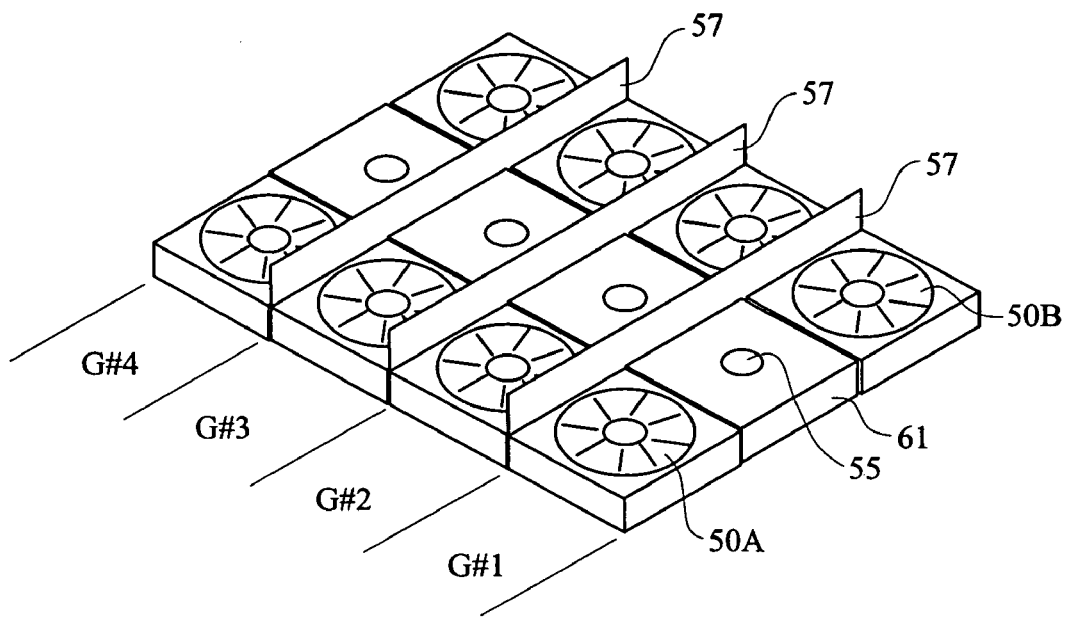
FIG. 11 is a diagram showing a hardware configuration example of the fan unit in the disk array apparatus according to the fourth embodiment of the present invention.

FIG. 11 shows an example of a hardware configuration of a noise reduction mechanism using the fan rotation control of the first fan unit 151. In the two fans 50A and 50B to be a pair of fans 50, the microphone 55 is disposed between the fans (at an intermediate position). Further, the first control unit (controller) 61 for connecting and mounting the microphone 55 is disposed so as to correspond to the microphone 55. The position of the first control unit (controller) 61 is not limited to the inside of the fan unit 151, and another position is also acceptable. Sounds (synthesized sounds) between the two fans 50A and 50B are detected by the microphone 55. The position of the microphone 55 is on the intermediate surface (axis) between the pair of the two fans 50A and 50B.

Further, in order to improve the effect of the characteristic configuration, a plurality of (for example, eight in total) fans 50 in the fan unit 151 are partitioned into a plurality of (for example, four) regions for each pair of the fans 50A and 50B by a plurality of (for example, three) noise insulation walls (partition plates) 57. Also, the divided regions correspond to the above-described group configuration. The microphone 55 is provided in each region with the pair of fans. In this case, the sounds detected by the microphone 55 are separated in each region, and the fan rotation control is performed in each region.

Fifth Embodiment

Next, a disk array apparatus 1 according to a fifth embodiment of the present invention will be described with reference to FIG. 12. The fifth embodiment has a basic configuration similar to that of the first embodiment, and the feature of the fifth embodiment lies in that an ANC function is provided for a plurality of fans 50 (not limited to the pairs) in the fan unit 151 and others to produce and synthesize phase-inverted sounds, thereby reducing the noises.

Figure 12:
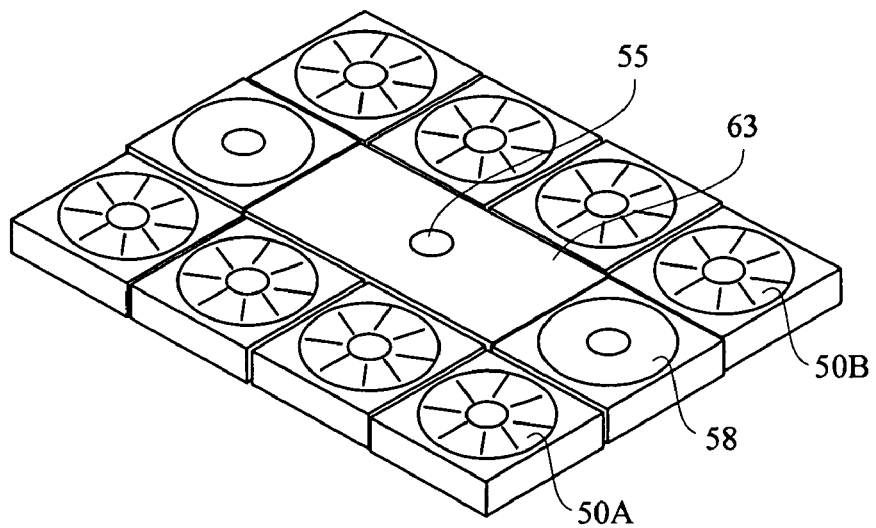
FIG. 12 is a diagram showing a hardware configuration example of a fan unit in a disk array apparatus according to a fifth embodiment of the present invention.

FIG. 12 shows a configuration example of the first fan unit 151 provided with the ANC function. For a plurality of fans 50 in the fan unit 151, the microphone 55 and the speakers 58 are disposed between the fans (at intermediate positions and the like). Further, a third control unit (ANC processing unit) 63 which connects and mounts the microphone 55 and the speaker 58 is disposed at a corresponding position. The position of the third control unit 63 is not limited to the inside of the fan unit 151, and another position is also acceptable. The third control unit 63 is provided with a digital signal processing (DSP) function and an amplification (AMP) function.

Sounds generated from a plurality of fans 50 (synthesized sounds) are detected by the microphone 55, and the detected sounds are inputted to the third control unit 63. The third control unit 63 directly judges the waveforms (phase inversion and the like) by DSP, produces a sound signal to be outputted to the speaker 58, and amplifies the signal by AMP to output it to the speaker 58. When the sound generated from the speaker 58 is synthesized with the sound (original sound) generated from a plurality of fans 50, the noise reduction can be achieved in the total output sound of the fan unit 151.

<System>

Figure 13:
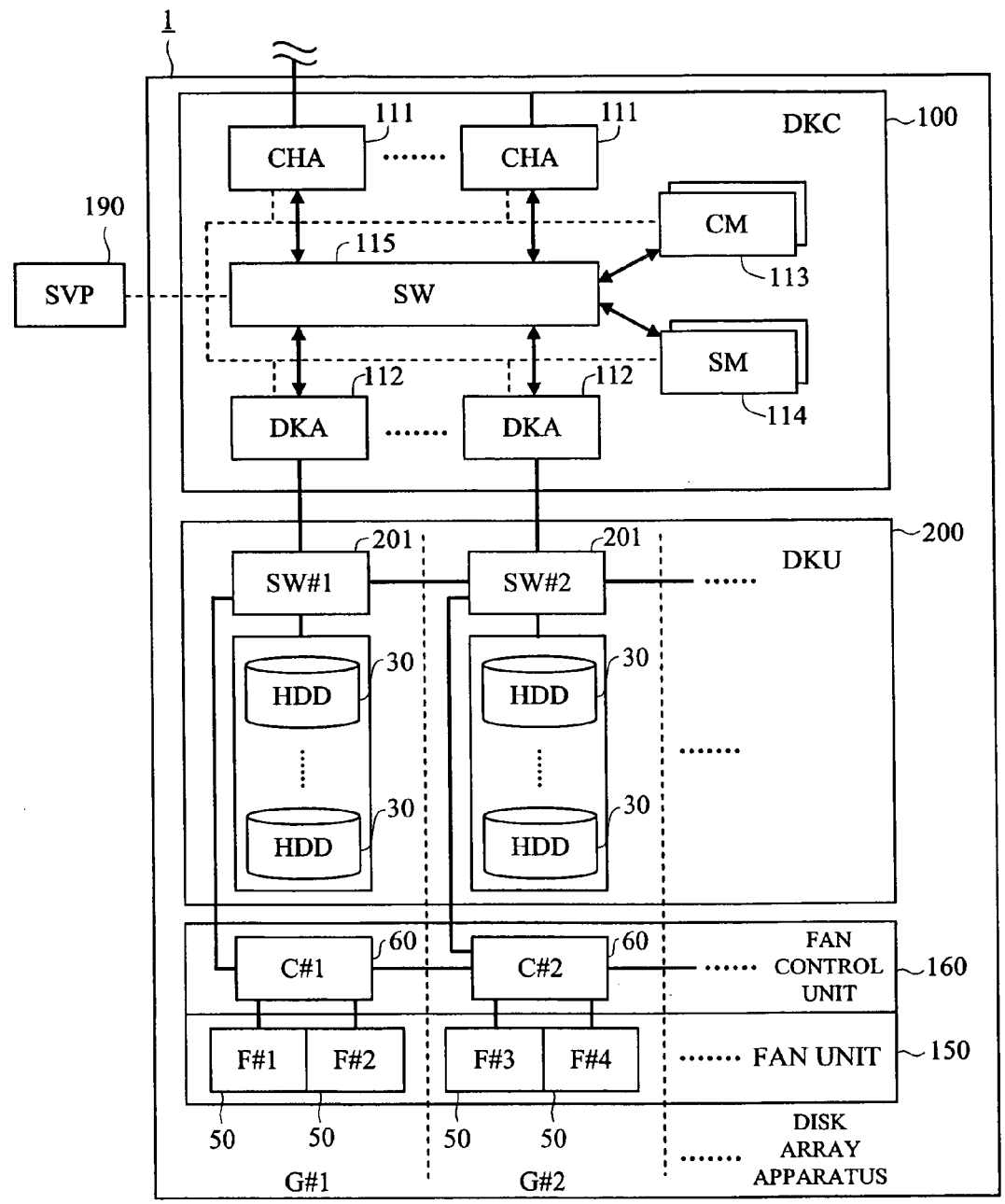
FIG. 13 is a block diagram showing a functional configuration example for the whole system in the disk array apparatus according to the fourth and fifth embodiments of the present invention.

Next, FIG. 13 shows an example of a functional system configuration of the disk array apparatus 1 relative to the control in the fourth and fifth embodiments.

The apparatus 1 has a fan unit 150 provided with a plurality of fans (F) 50 and corresponding to the first fan unit 151 and the second fan unit 152. A fan control unit 160 provided with a control unit (C) 60 is connected to the fan unit 150. The control unit (C) 60 corresponds to functions (at least one function or a combination) of the first control unit 61, the second control unit 62, and the third control unit 63 described above. Though a configuration where one control unit (C) 60 is provided for each pair of fans (F) 50 has been described, the configuration where control units 60 are integrated into one unit in the fan control unit 160 is also possible.

In the MAID control by the second control unit 62 in the fourth embodiment, operation of the HDD 30 having small number of disk accesses in the disk array is stopped, and the operation is started when the disk access is required. Then, in accordance with the operation/non-operation of the HDDs 30, the operation/non-operation and the number of rotations of the reference fan 50A at positions corresponding to the HDDs (group and the like) are controlled by the control unit 60 (second control unit 62).

Further, in the temperature detection control by the second control unit 62 in the fourth embodiment, temperature in the vicinity of the HDD 30 on the cooling air flow path is detected by a temperature sensor, and operation/non-operation and the number of rotations of the reference fan 50A on the cooling air flow path are controlled in accordance with the detected temperature.

An example of a system configuration of the apparatus 1 will be described in detail with reference to FIG. 13. The apparatus 1 has a disk controller (DKC) 100, a disk unit (DKU) 200, a fan control unit 160, a fan unit 150, and others. The DKC 100 is formed by mutually connecting the logic boards 10 in the logic box 20. The disk arrays in the DKU 200 are formed of a group of the HDDs 30 in the HDD box 40. The HDDs 30, the control units (C) 60, the fans (F) 50, and others are divided into groups (G#1, G#2, . . . ) and managed based on the groups. Further, a service processor (SVP) 190 is connected to each unit such as channel adapters (CHAs) 111 in the DKC 100 through an internal LAN. The SVP 190 is an information processor for dealing with the processes related with maintenance and management of the apparatus 1.

The DKC 100 controls data input to and output from a storage region on the HDD 30 and storage therein in response to requests and instructions from the host system. The DKC 100 has various functions such as CHA 111, a disk adapter (DKA) 112, a cache memory (CM) 113, a shared memory (SM) 114, a switch (SW) 115 (for example, a crossbar switch), and others. The CHA 111 is connected to the host system and the like. The DKA 112 is connected to a plurality of switches SW (for example, fiber channel switch) 201 in the DKU 200. Input and output data for the HDD 30 are temporarily stored in the CM 113. Control information and others are stored in the SM 114.

The SW 201 in the DKU 200 controls a plurality of HDDs 30 based on control from the DKA 112. Also, the function of the SW 201 can be included in the DKA 112. Further, the MAID control and the temperature detection control can be performed by the SW 201, the DKA 112, and others.

The control unit (C) 60 in the fan control unit 160 is connected to the SW 201 and others, and it controls the fans 50 in the fan unit 150 based on control from a higher level. The control unit (C) 60 performs control processing by, for example, executing control programs. For example, the control unit (C) 60 has a function of the first control unit 61 or the third control unit 63, and the SW 201 has a function of the second control unit 62.

Also, when a plurality of fans 50 are provided in the fan unit 150, it is possible to collectively control the fans 50 in the same manner. Alternatively, it is also possible to selectively control the fans. More specifically, the configuration in which fans 50 (pair) corresponding to a specific group are selected to control the fan rotation is also possible.

<Combinations>

As the combined configuration of the above-described embodiments, the following configurations are possible. For example, a combined configuration of the first and second embodiments (duct structure) and the third embodiment (two-stage fan), a combined configuration of the first and second embodiments (duct structure) and the fourth embodiment (fan rotation control), and a combined configuration of the first and second embodiments (duct structure) and the fifth embodiment (ANC function) are possible.

Further, a combined configuration of the third embodiment (two-stage fan) and the fifth embodiment (ANC function) and a combined configuration of the fourth embodiment (fan rotation control) and the fifth embodiment (ANC function) are possible. In these configurations, noises which have not been completely reduced in the fan units 151 and 152 according to the third and fourth embodiments are reduced using the ANC function in the fifth embodiment. Also, the configuration in which the third embodiment (two-stage fan) is applied to a part of (for example, half of) a plurality of fans 50 and the ANC function according to the fifth embodiment is applied to the rest to enhance the noise reduction effect is also possible.

Moreover, a combined configuration of the fourth embodiment (fan rotation control) and the fifth embodiment (ANC function) is also possible. In this case, for example, noises are usually reduced by fan rotation control, and noises are reduced by the ANC function in a state where a reference fan 50A is operated by the MAID control. Further, in the combined configuration described above, a specific frequency (primary Nz, secondary Nz, tertiary Nz, and the like) to be the target of the noise reduction is set separately for each of the characteristic configurations (duct structure, two-stage fan, fan rotation control, and ANC function, and others).

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be used for a disk array apparatus and others.

What is claimed is:

1. A disk array apparatus, comprising:
   a disk array and a controller thereof;
   a first fan unit including a plurality of fans in an upper part of the disk array apparatus, the plurality of fans being arranged in a horizontal direction in the first fan unit;
   an exhaust duct unit having an exhaust structure and an exhaust port for exhaust to an outside from the first fan unit; and
   a cooling air flow path for air flow extending from a lower part of the disk array apparatus through which air is taken in from the outside via operation of the first fan unit, through the disk array apparatus, and through the fans of the first fan unit to the outside through the exhaust duct unit,
   wherein the exhaust structure of the exhaust duct unit is divided into a plurality of exhaust flow paths extending from the plurality of fans of the first fan unit to the exhaust port by a plurality of partition plates being arranged in accordance with the fans of the first fan unit such that a respective pair of exhaust flow paths of the plurality of exhaust flow paths is associated with each pair of fans of the plurality of fans of the first fan unit, and
   wherein a difference in flow path length between a first exhaust flow path and a second exhaust flow path of each pair of exhaust flow paths is equivalent to a half wavelength of a specific frequency of noise generated by air flow passing along the cooling air flow path through the first fan unit such that a first sound of the specific frequency generated by the first fan unit is synthesized by a second sound of a phase that is inverted to that of the first sound produced by air flow passing along the cooling air flow path through the exhaust structure to reduce the noise generated by air flow passing along the cooling air flow path through the first fan unit.

2. A disk array apparatus, comprising:
   a first box having a plurality of storage devices forming a disk array installed therein from front and rear surfaces of the first box in a first region in an upper part of the disk array apparatus;
   a second box having a plurality of logic boards forming a controller of the disk array installed therein from front and rear surfaces of the second box in a second region in a lower part of the disk array apparatus;
   a first fan unit including a plurality of fans on the first box in the upper part of the disk array apparatus; and
   a first cooling air flow path for air flow extending from a first side duct unit disposed on at least one of the front and rear surfaces of the second box in the second region through which air is taken in from an outside via operation of the first fan unit, through the first side duct unit and a center duct unit within the disk array apparatus, and exhausted to the outside through the first box and the first fan unit,
   wherein the first side duct unit includes a plurality of ducts or a plurality of flow paths divided by partition plates through which air is taken in from the outside,
   wherein a pair of ducts of the plurality of ducts or a pair of flow paths of the plurality of flow paths of the first side duct unit are laterally adjacent to each other from a right to left direction or located at corresponding positions on the front and rear surfaces of the second box, and
   wherein the pair of ducts or flow paths are shaped such that a difference in flow path length between a first duct or flow path and a second duct or flow path of the pair of ducts or flow paths is equivalent to a half wavelength of a specific frequency of noise generated by air flow passing along the first cooling air flow path through the fans in the first fan unit such that a first sound of the specific frequency generated by the first fan unit is synthesized by a second sound of a phase that is inverted to that of the first sound produced by air flow passing along the first cooling air flow path through the first side duct unit to reduce the noise generated by air flow passing along the first cooling air flow path through the first fan unit.

3. A disk array apparatus, comprising:
   a first box having a plurality of storage devices forming a disk array installed therein from front and rear surfaces of the first box in a first region in an upper part of the disk array apparatus;
   a second box having a plurality of logic boards forming a controller of the disk array installed therein from front and rear surfaces of the second box and having a ventilation characteristic in a vertical direction in a second region in a lower part of the disk array apparatus;
   a second fan unit including a plurality of fans on the second box in an intermediate part of the disk array apparatus; and
   a second cooling air flow path for air flow extending from a second side duct unit disposed on at least one of first and second side surfaces of the first box in the first region through which air is taken in from an outside via operation of the second fan unit, through the second box and the fans of the second fan unit, and exhausted to the outside from the second fan unit,
   wherein the second side duct unit includes a plurality of ducts or a plurality of side flow paths divided by partition plates through which air is taken in from the outside,
   wherein a pair of ducts of the plurality of ducts or a pair of side flow paths of the plurality of side flow paths of the second side duct unit are laterally adjacent to each other from a front to rear direction, and
   wherein the pair of ducts or side flow paths are shaped such that a difference in flow path length between a first duct or side flow path and a second duct or side flow path of the pair of ducts or side flow paths is equivalent to a half wavelength of a specific frequency of noise generated by air flow passing along the second cooling air flow path through the fans in the second fan unit such that a first sound of the specific frequency generated by the second fan unit is synthesized by a second sound of a phase that is inverted to that of the first sound produced by air flow passing along the second cooling air flow path through the second side duct unit to reduce the noise generated by air flow passing along the second cooling air flow path through the second fan unit.

* * * * *